United States Patent
Fontana et al.

(10) Patent No.: US 10,283,441 B2
(45) Date of Patent: May 7, 2019

(54) METHOD OF INTEGRATING CAPACITORS ON LEAD FRAME IN SEMICONDUCTOR DEVICES

(71) Applicant: STMICROELECTRONICS S.R.L., Agrate Brianza (IT)

(72) Inventors: Fulvio Vittorio Fontana, Monza (IT); Giovanni Graziosi, Vimercate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 120 days.

(21) Appl. No.: 15/282,619

(22) Filed: Sep. 30, 2016

(65) Prior Publication Data
US 2017/0250128 A1    Aug. 31, 2017

(30) Foreign Application Priority Data
Feb. 26, 2016  (IT) .......... 102016000020111

(51) Int. Cl.
*H01L 23/495*   (2006.01)
*H01L 21/48*    (2006.01)
(Continued)

(52) U.S. Cl.
CPC .... *H01L 23/49589* (2013.01); *H01L 21/4825* (2013.01); *H01L 21/565* (2013.01);
(Continued)

(58) Field of Classification Search
CPC .......... H01L 23/49503; H01L 23/4952; H01L 23/49541; H01L 23/3114; H01L 21/4825; H01L 21/55; H01L 28/60
See application file for complete search history.

(56) References Cited

U.S. PATENT DOCUMENTS 4,714,952 A * 12/1987 Takekawa ............... H01L 24/32
                                                            174/535
5,258,575 A * 11/1993 Beppu ................... H01L 23/057
                                                            174/557
(Continued)

FOREIGN PATENT DOCUMENTS

CN    103872013 A    6/2014
JP    61-67231 A     4/1986
(Continued)

OTHER PUBLICATIONS

DuPont, "DuPont 5018: UV Curable Dielectric," *MCM5018*, Jun. 2012, 3 pages.
(Continued)

*Primary Examiner* — Michael Jung
(74) *Attorney, Agent, or Firm* — Seed IP Law Group LLP

(57) ABSTRACT

In an embodiment, a method of integrating capacitors in semiconductor devices includes: providing a lead-frame for a semiconductor device, the lead-frame including one or more electrically conductive areas, forming a dielectric layer over the electrically conductive area or areas, forming an electrically conductive layer over the dielectric layer thus forming one or more capacitors including the dielectric layer sandwiched between an electrically conductive area and the electrically conductive layer, and arranging a semiconductor die onto the lead-frame by providing electrical contact between the semiconductor die and the electrically conductive layer.

19 Claims, 14 Drawing Sheets

(51) Int. Cl.
*H01L 21/56* (2006.01)
*H01L 23/31* (2006.01)
*H01L 49/02* (2006.01)

(52) U.S. Cl.
CPC ...... *H01L 23/3114* (2013.01); *H01L 23/4952* (2013.01); *H01L 23/49503* (2013.01); *H01L 23/49541* (2013.01); *H01L 23/49548* (2013.01); *H01L 23/49575* (2013.01); *H01L 23/49582* (2013.01); *H01L 23/49586* (2013.01); *H01L 28/60* (2013.01); *H01L 23/3107* (2013.01); *H01L 2224/16245* (2013.01); *H01L 2924/181* (2013.01)

(56) References Cited

U.S. PATENT DOCUMENTS

| | | | |
|---|---|---|---|
| 6,054,754 | A | 4/2000 | Bissey |
| 6,538,313 | B1 | 3/2003 | Smith |
| 7,166,905 | B1 | 1/2007 | Shah |
| 9,165,873 | B1 * | 10/2015 | Howard ............ H01L 23/49589 |
| 2003/0011050 | A1 | 1/2003 | Bissey |
| 2008/0023843 | A1 * | 1/2008 | Hiraga .............. H01L 23/49531 |
| | | | 257/773 |
| 2010/0230784 | A1 | 9/2010 | Teggatz et al. |
| 2012/0032301 | A1 * | 2/2012 | Kasuga .................... H01G 9/15 |
| | | | 257/532 |
| 2012/0126416 | A1 | 5/2012 | Lee et al. |
| 2012/0168921 | A1 | 7/2012 | Tan et al. |
| 2013/0154071 | A1 * | 6/2013 | Haigh ............... H01L 23/49503 |
| | | | 257/676 |
| 2013/0256390 | A1 | 10/2013 | Yamaguchi et al. |

FOREIGN PATENT DOCUMENTS

| | | |
|---|---|---|
| JP | 5-326821 A | 12/1993 |
| JP | 6-85156 | 3/1994 |
| JP | 6-216309 A | 8/1994 |
| JP | 7-45781 A | 2/1995 |

OTHER PUBLICATIONS

Ormet Circuits Inc., "DAP689," Preliminary Technical Data Sheet dated May 2015, 2 pages.
Toray, ""Raybrid" Photodefinable Heat Resistance and High Dielectric Constant Paste," Technical Data Sheet, Jun. 2009, 1 page.

* cited by examiner

METHOD OF INTEGRATING CAPACITORS ON LEAD FRAME IN SEMICONDUCTOR DEVICES

BACKGROUND

Technical Field

The description relates to semiconductor devices.

One or more embodiments may apply to integrating capacitors in semiconductor devices, e.g., in a metal lead-frame of an integrated circuit.

One or more embodiments may apply to integrating capacitors in metal lead-frame packages using Flip Chip technology.

Description of the Related Art

Integrating capacitances (capacitors) in semiconductor devices has been the subject-matter of extensive investigation and experimentation. Integrating a capacitance (capacitor) in a semiconductor device, e.g., in a metal lead-frame of an integrated circuit may involve using various technologies. Exemplary of these are the solution disclosed in US 2003/0011050 A1 (which involves the use of a dedicated two-layer lead-frame) or the solution disclosed in US 2010/0230784 A1 (which exhibits certain limitations in terms of the maximum area of the capacitor electrodes (shields) and the distance between them).

BRIEF SUMMARY

Despite the prior art activity, it would be desirable to provide improved solutions which may be applied to packages such as, e.g., flip chip packages including features such as solder bumps, copper pillars, or so-called stud bumps (including materials such as gold, silver, or copper), possibly using standard lead-frames.

According to one or more embodiments, a method includes:

forming a capacitor, wherein forming the capacitor includes:
  forming a dielectric layer on an electrically conductive area of a lead-frame,
  forming an electrically conductive layer on said dielectric layer, wherein forming the electrically conductive layer includes sandwiching said dielectric layer between said electrically conductive area and said electrically conductive layer, and
arranging a semiconductor die onto said lead-frame and electrically connecting said semiconductor die to said electrically conductive layer.

One or more embodiments may relate to a corresponding semiconductor device, e.g., an integrated circuit.

One or more embodiments are directed to a semiconductor device that includes:

a lead-frame including an electrically conductive area,
a dielectric layer formed on said electrically conductive area,
an electrically conductive layer formed on said dielectric layer, said dielectric layer being sandwiched between said electrically conductive area and said electrically conductive layer, the electrically conductive area, dielectric area, and electrically conductive layer forming a capacitor integrated in the device, and
a semiconductor die arranged onto said lead-frame and electrically connected to said electrically conductive layer.

The claims are an integral part of the technical disclosure of one or more embodiments as provided herein.

One or more embodiments make it possible to integrate a high capacitance value in a semiconductor device without resorting, e.g., to discrete capacitances attached to the lead-frame.

One or more embodiments make it possible to use standard packaging processes, while keeping interconnections between capacitance(s) and device short.

In one or more embodiments, parasitics may be reduced due to bumps providing the main contribution.

One or more embodiments permit to pursue package miniaturization, by making it possible, e.g., to produce semiconductor devices with integrated capacitance(s) having the same size (e.g., single die) of a device without such capacitance(s).

One or more embodiments may be applied to organic- and/or ceramic-based packaging technologies, possibly using a solder mask opening as a cavity with the capability of giving rise to solutions which are more effective than standard organic prepreg materials due to a thin dielectric profile.

One or more embodiments may be applied to a variety of technologies such as Quad-Flat No-Leads (QFN), Quad Flat Package (QFP), Thin Small Outline Package (TSOP).

One or more embodiments may include a dielectric layer produced by a film or jet-printed dielectric material and/or a conductive material layer produced, e.g., by screen printing low temperature sintered composite materials based on microparticles (copper-silver) or jet-print-dispensing nano-particles (such as copper, silver, carbon) and other conductive materials.

BRIEF DESCRIPTION OF THE SEVERAL VIEWS OF THE DRAWINGS

One or more embodiments will now be described, purely by way of example, with reference to the annexed figures, in which.

It will be appreciated that, for the sake of clarity, various figures may not be reproduced to a same scale.

DETAILED DESCRIPTION

In the ensuing description, one or more specific details are illustrated, aimed providing an in-depth understanding of examples of embodiments of this disclosure. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiment.

One or more embodiments as exemplified herein may be applied to manufacturing semiconductor devices (e.g., integrated circuits) by resorting, e.g., to Flip-Chip (FC) technology as used, for instance, in producing Quad Flat No-Lead (QFN) integrated circuits.

Figure 1:
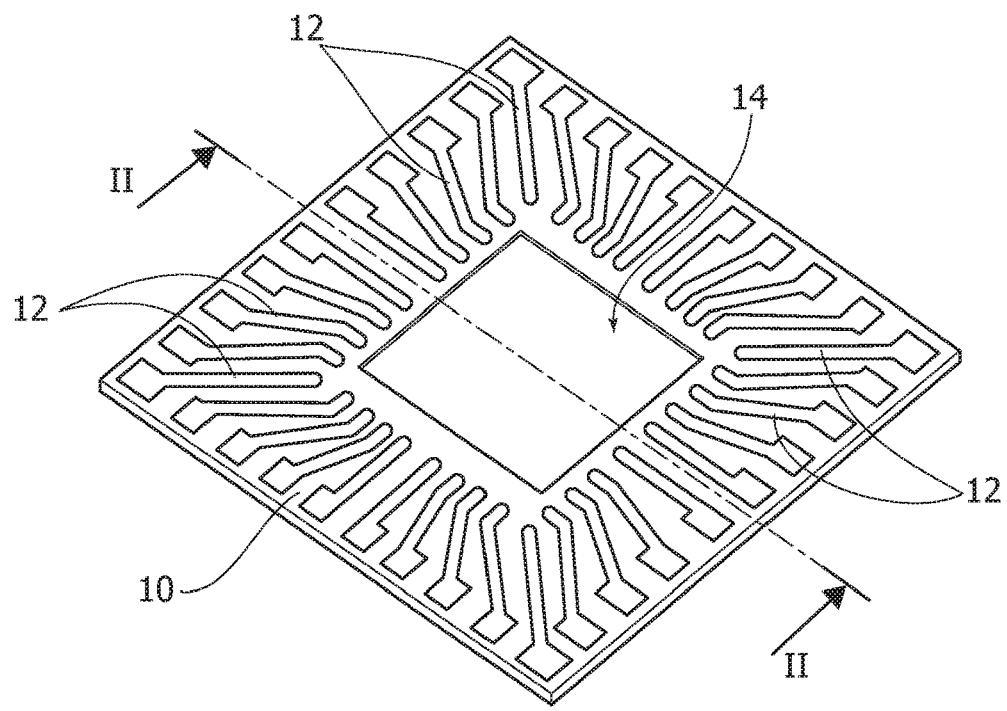
FIGS. 1 to 11 are exemplary of various steps in one or more embodiments with FIGS. 2, 4, 6, 8, and 11 representing cross-sectional views along line II-II of FIG. 1, line IV-IV of FIG. 3, line VI-VI of FIG. 5, line VIII-VIII of FIG. 7 and line XI-XI of FIG. 10, respectively.

As schematically represent in FIG. 1, one or more embodiments may involve providing a metal (e.g., copper) lead-frame 10 having, e.g., selectively plated parts 12 provided thereon by known means.

Figure 2:
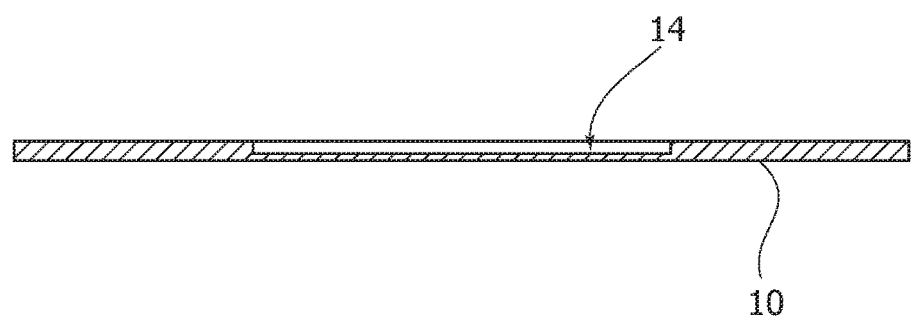

In one or more embodiments (see, e.g., the cross sectional view of FIG. 2) the lead-frame 10 may include a central (possibly recessed or depressed) portion 14, e.g., of quadrilateral/square shape.

In one or more embodiments a recessed portion 14 may be etched (by any standard etching process) to approximately half the thickness of the lead-frame 10, e.g., to a depth of 50 microns ($50 \cdot 10^{-6}$ m).

Figure 3:
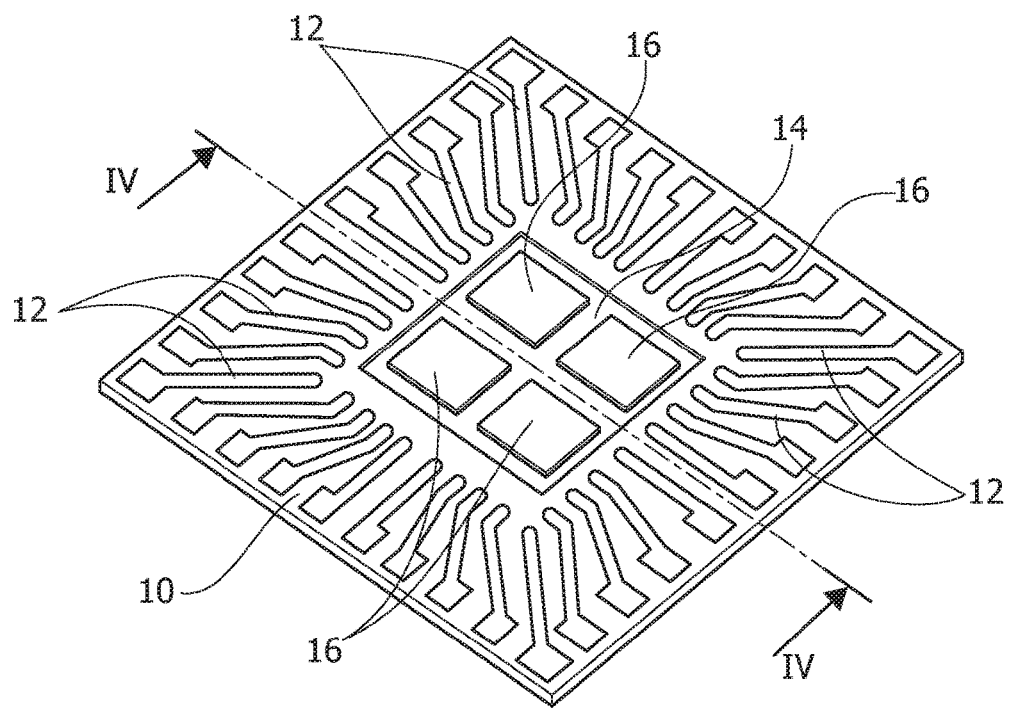
Figure 4:
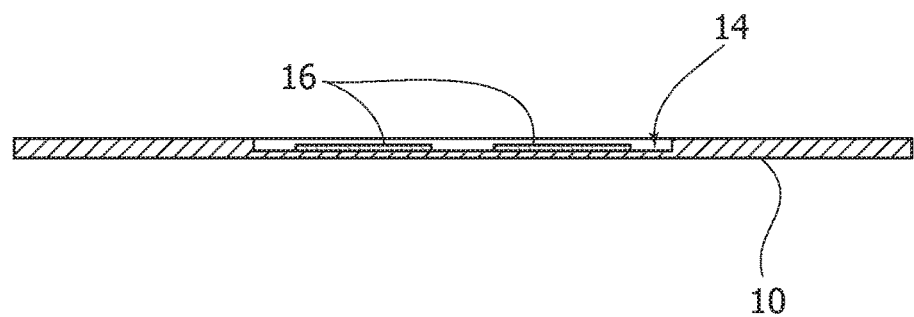

FIGS. 3 and 4 are exemplary of the formation of a dielectric layer 16 at the portion 14.

In one or more embodiments the dielectric layer 16 may include plural portions separated by gaps therebetween.

In one or more embodiments as exemplified herein, the dielectric layers 16 may include four "lands" arranged in a square matrix-like arrangement and separated by a cross-like pattern of gaps. It will be otherwise appreciated that such arrangement is merely exemplary and not mandatory.

Techniques for producing the dielectric layer 16 may include, e.g., screen printing or jet printing, possibly followed by curing such as UV curing.

An exemplary dielectric material for use in one or more embodiments may include the UV-curable dielectric sold under the trade name of DuPont 5018 by DuPont Microcircuit Materials of Research Triangle Park, NC, USA. Such material lends itself to being printed with a thickness of 20+/−10 micron ($20+/-10\times10^{-6}$ m).

Another exemplary dielectric material for use in one or more embodiments may include the jet-printable material sold under the trade name of RAYBRID™ by Toray of Big Beaver Road, Troy, Mich., USA.

Such material can be jet-printed with the thickness of 6+/−2 microns ($6+/-2\times10^{-6}$ m).

Figure 5:
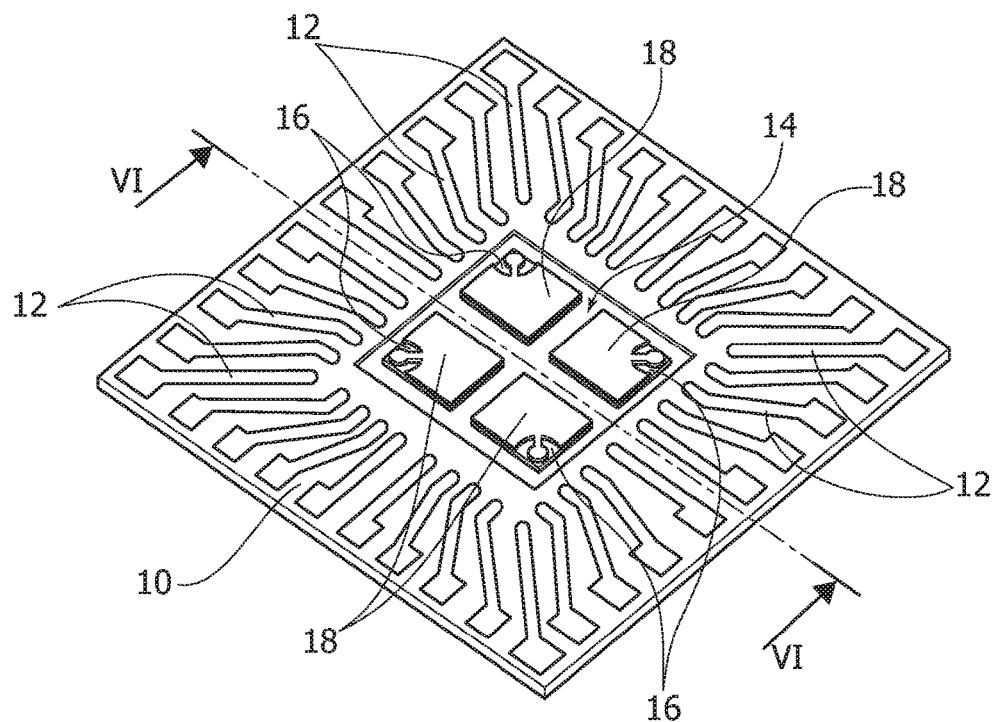
Figure 6:
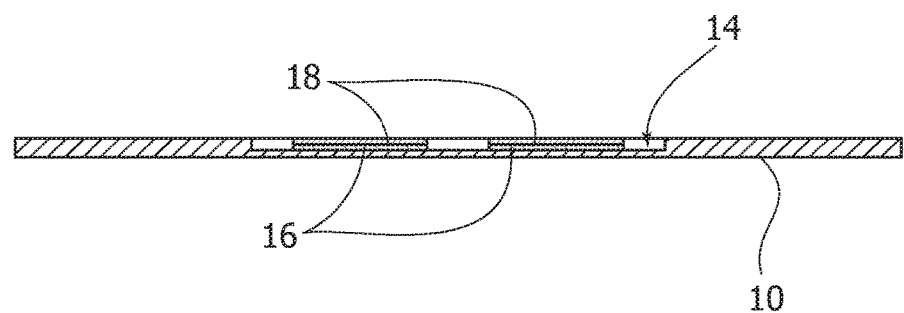

FIGS. 5 and 6 are exemplary of the possible formation of a conductive layer 18 over the dielectric layer(s) 16.

In one or more embodiments, the conductive layer 18 may include a screen-printed conductive layer.

An exemplary conductive material for use in one or more embodiments may include the material sold under the trade name Ormet DAP 689 available with Ormet Circuits, Inc., Nancy Ridge Drive, San Diego Calif., USA.

Such a conductive layer 18 may be screen-printed with a thickness of 25+/−10 microns ($25+/-10\cdot10^{-6}$ m).

In one or more embodiments, with the area 14 being recessed, the area 14 may house the dielectric layer 16 and the electrically conductive layer 18.

Figure 7:
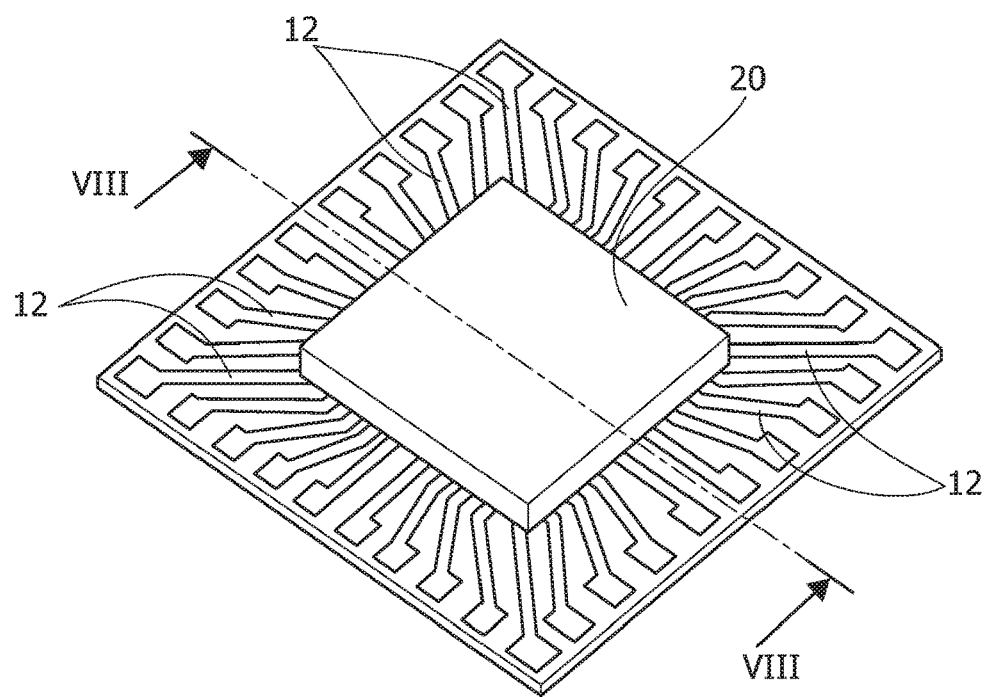
Figure 8:
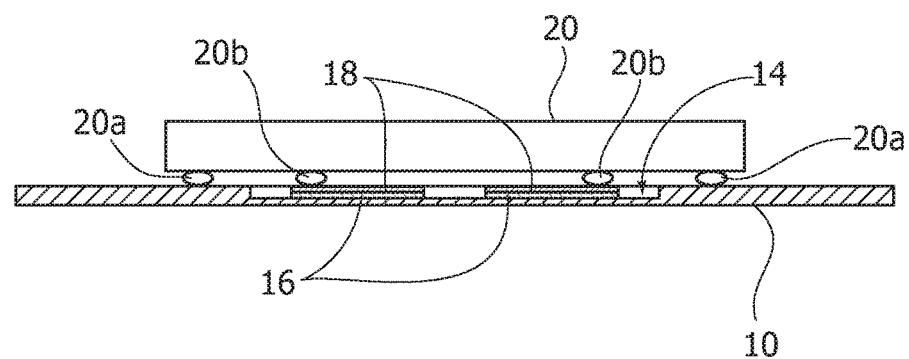

FIGS. 7 and 8 are exemplary of the possibility of mounting onto the assembly of FIGS. 5 and 6 a semiconductor chip or die 20 provided with electrical contact pads (not visible in the figures) adapted to be electrically connected:
- to the leads in the lead-frame 10, via first electrical connections 20a, and
- to the capacitor(s) formed by the dielectric layer 16 sandwiched between the lead-frame body 10 (e.g., the bottom surface of the cavity 14) and the conductive layer(s) 18 via one or more second electrical connections 20b.

The connections 20a, 20b may be formed by a variety of technologies.

Connection technologies suitable for use in one or more embodiments may include flip chip attach techniques (e.g., Sn/Ag/Cu or SAC bumps), possibly including oven reflow (e.g., at 260° C. peak temperature) to sinter the conductive layer 18 and to reflow the SAC bumps.

Figure 9:
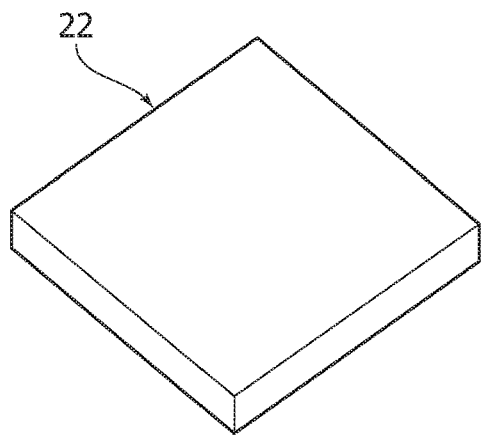
Figure 10:
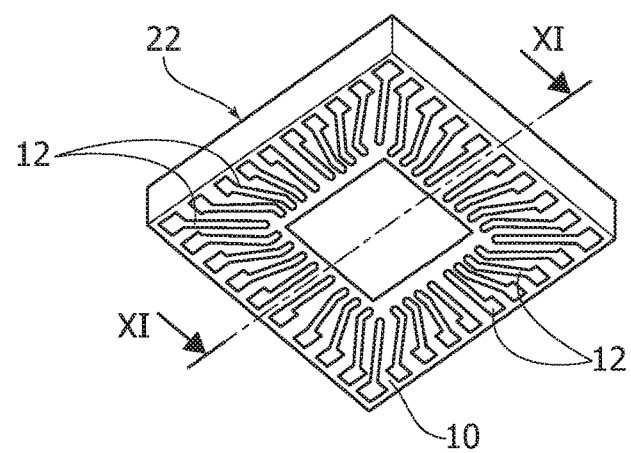
Figure 11:
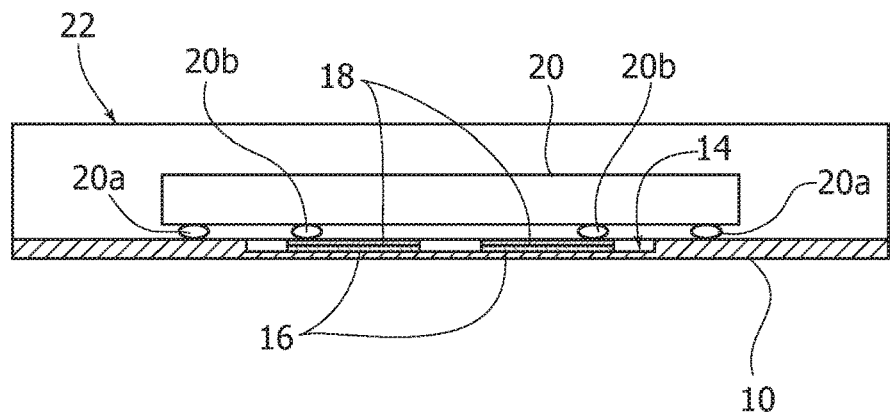

FIGS. 9 to 11 are exemplary of a package material 22 such as a package molding compound (PMC) being molded, with any known technology for that purpose onto the assembly shown in FIGS. 7 and 8 to complete the semiconductor device, the process possibly including etching the leadframe 12 at the back surface.

Figure 12:
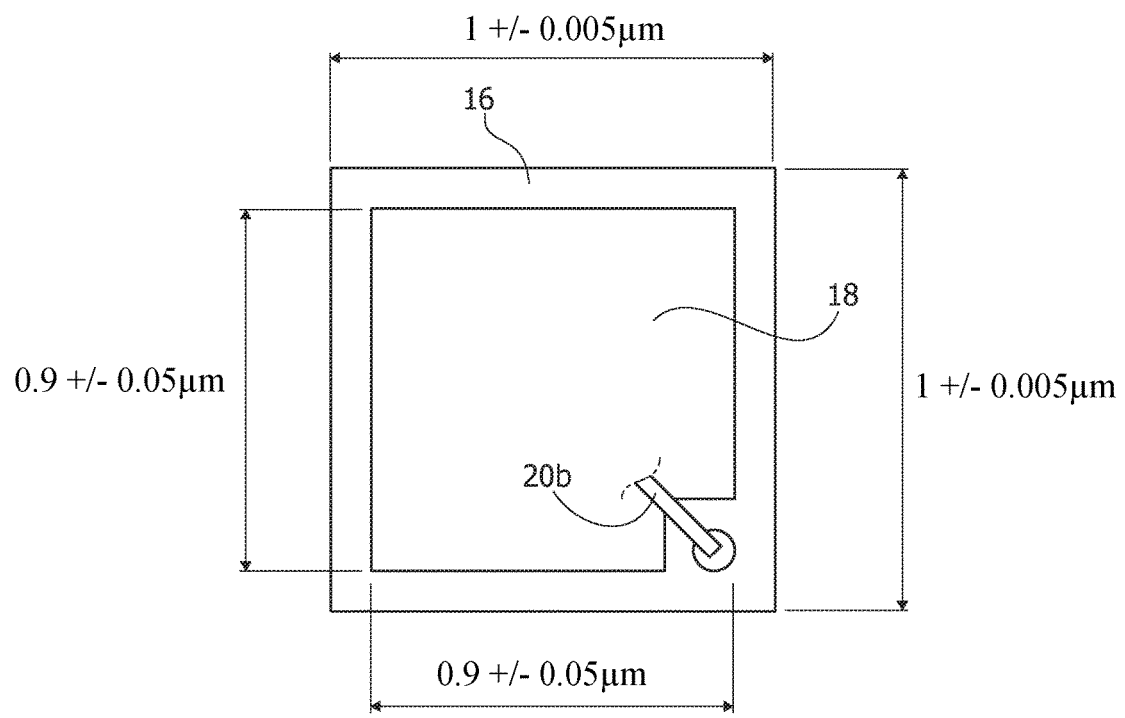
FIG. 12 is exemplary of dielectric v. conductive layer dimension tolerances in one or more embodiments.

FIG. 12 is a schematic plan view exemplary of possible dimensional dielectric layer 16 v. conductive layer 18 dimension tolerances (expressed in micron units: 1 micron=$10^{-6}$ m).

FIG. 12 is also exemplary of the possible provision of an electrical connection 20b (power or signal capacitance connection).

Figure 13:
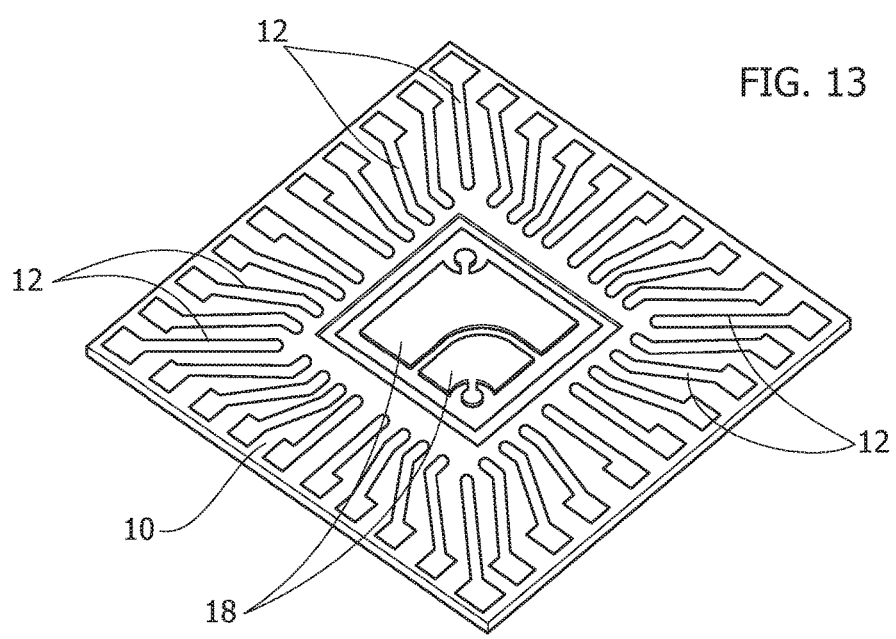
FIG. 13 is exemplary of possible features of one or more embodiments.

FIG. 13 is generally exemplary of the extensive degree of freedom in producing the shape and/or surface of the dielectric layer 16 and/or the conductive layer 18 by direct contrast to the exemplary cross-like arrangement shown, e.g., in FIG. 5.

FIGS. 14 to 25 are exemplary of the possibility of applying the concepts exemplified in the foregoing to producing a (e.g., flip chip) capacitor adapted to be connected to an external ground GND through a contact.

Figure 14:
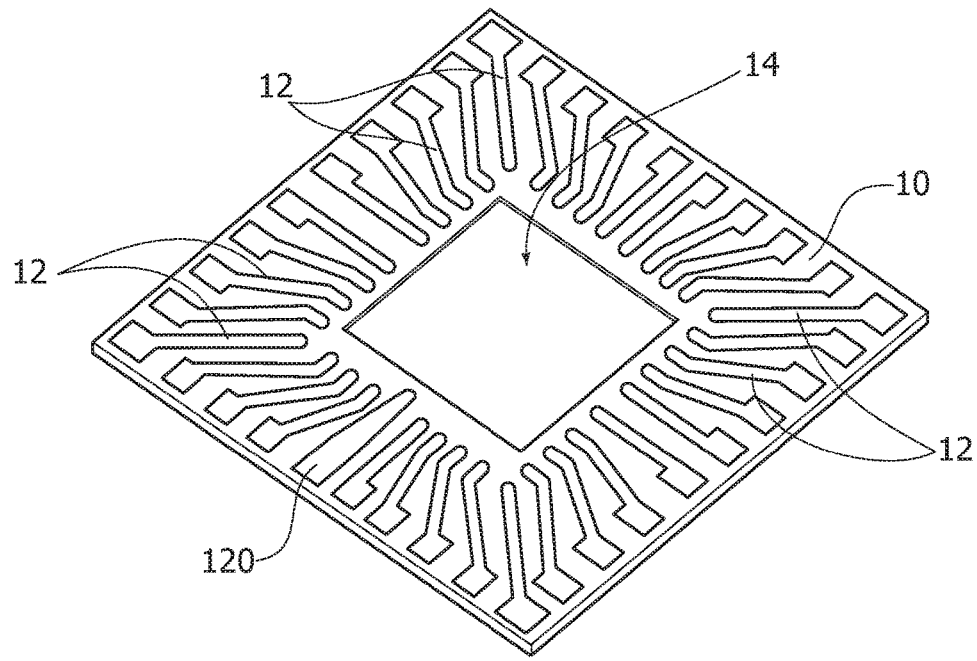
FIGS. 14 to 25 are exemplary of further possible embodiments with FIGS. 17, 19, 23 and 25 representing cross-sectional views along line XVII-XVII of FIG. 16, line XIX-XIX of FIG. 18, line XXIII-XXIII of FIG. 22 and line XXV-XXV of FIG. 24, respectively.
Figure 15:
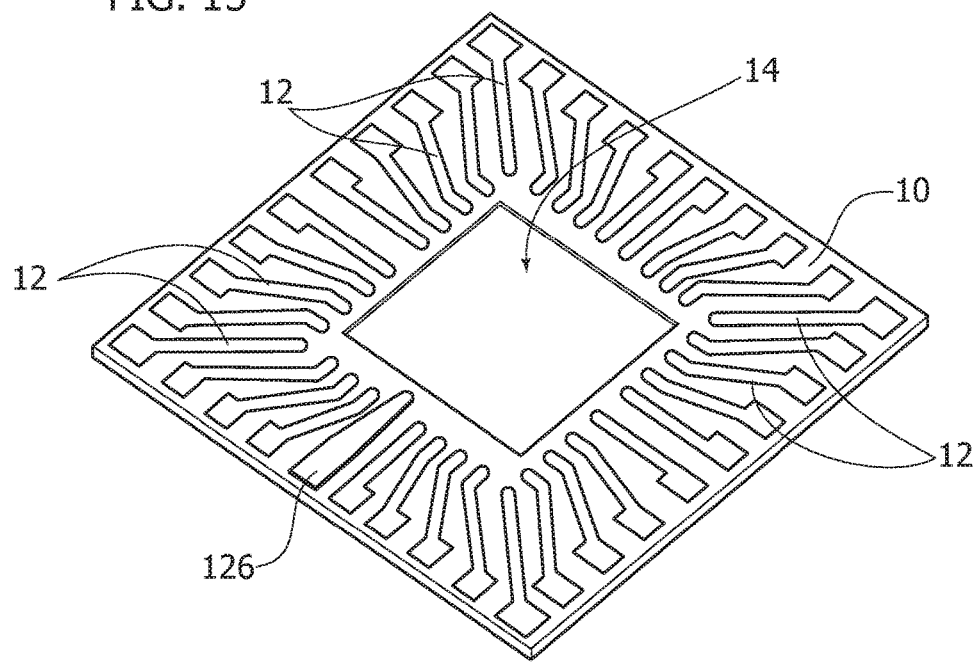
Figure 16:
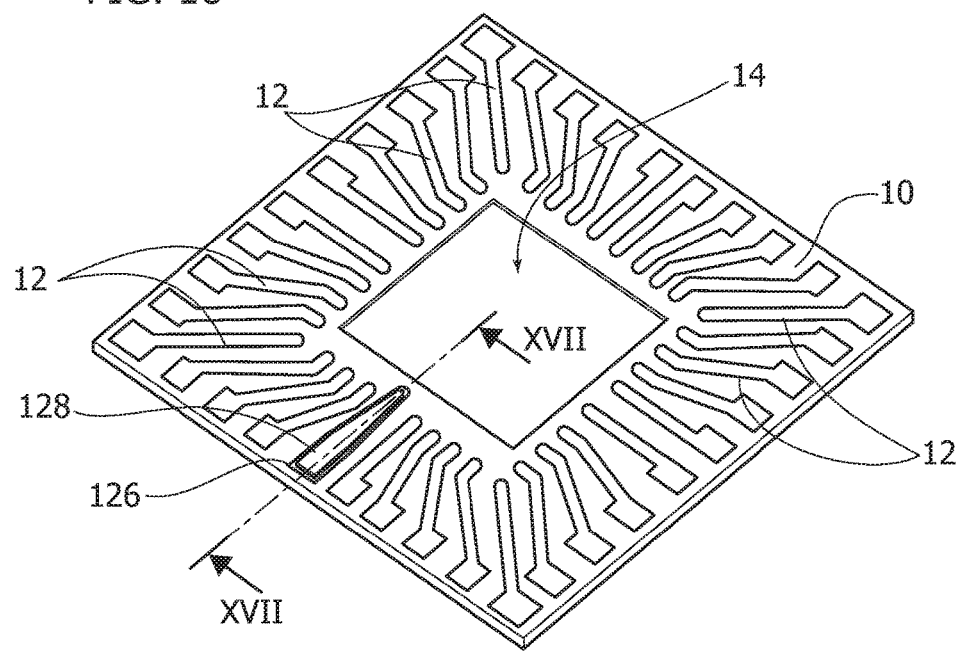

For instance, FIG. 14 is exemplary of the possibility of utilizing/configuring one of the leads in the lead-frame 10 (e.g., an enlarged plated pad 120) by forming thereon, e.g., by jet printing, a dielectric layer 126 (FIG. 15) onto which a conductive layer 128 may be formed (FIG. 16), e.g., by screen printing. A possible resulting arrangement is exemplified in the cross-sectional view of FIG. 17.

The same materials previously exemplified in connection with the layers 16 and 18 may be used in producing the dielectric layer 126 and the conductive layer 128 to form a capacitor including the dielectric layer 126 sandwiched between the conductive layer 128 and the pad 120.

Figure 17:
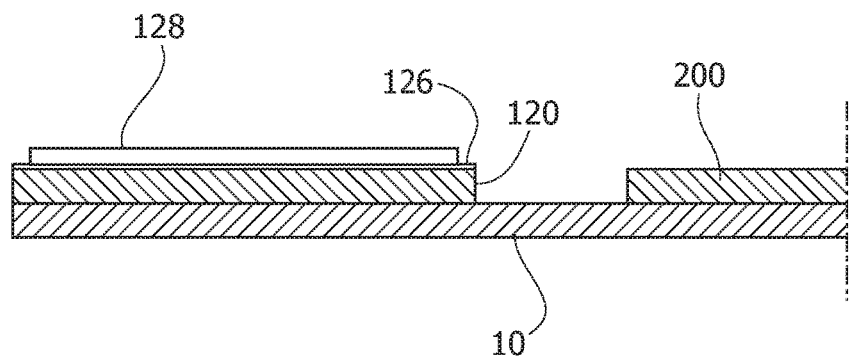
Figure 18:
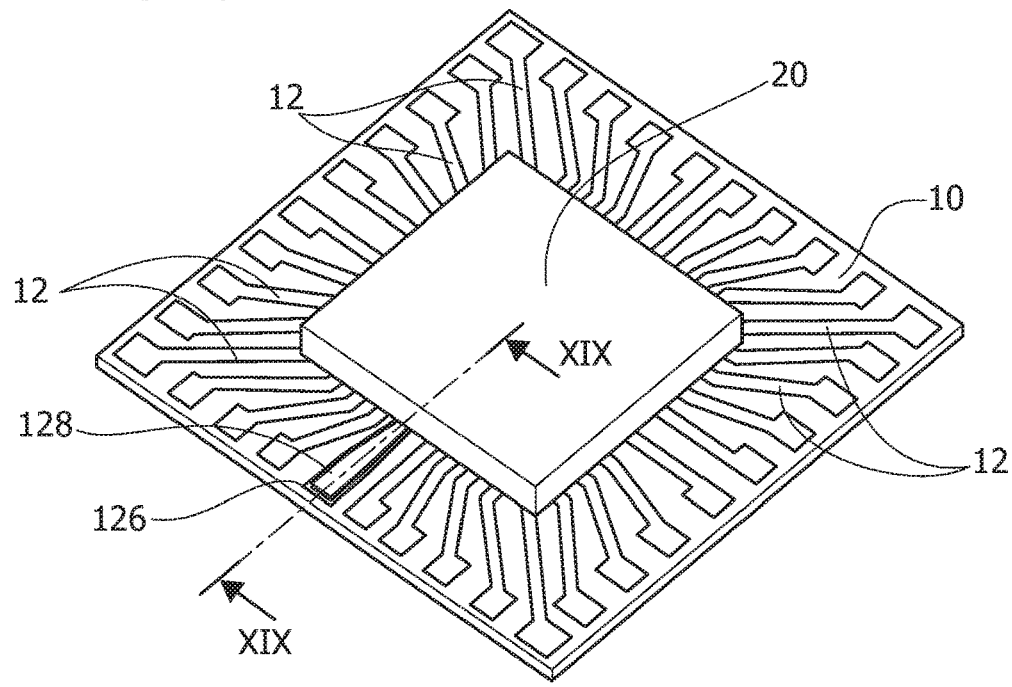

FIG. 18 is exemplary of the possibility of mounting onto the assembly of FIG. 17 a semiconductor die 20 which, in addition to a set of connections to a die pad set 200 located inwardly of the lead-frame 10 (not visible in the figures), may include one or more connections 20b to the conductive layer 128, that is to the capacitor including the dielectric layer 126 sandwiched between the conductive layer 128 and the pad 120 of the lead-frame 10.

Figure 19:
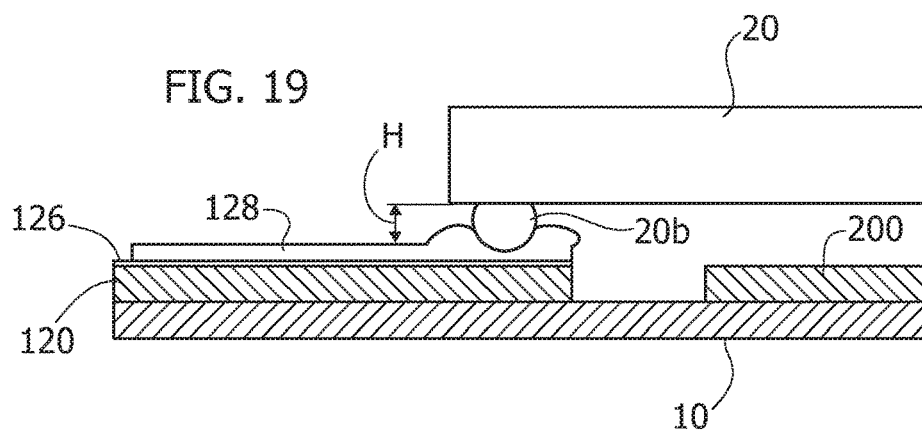
Figure 20:
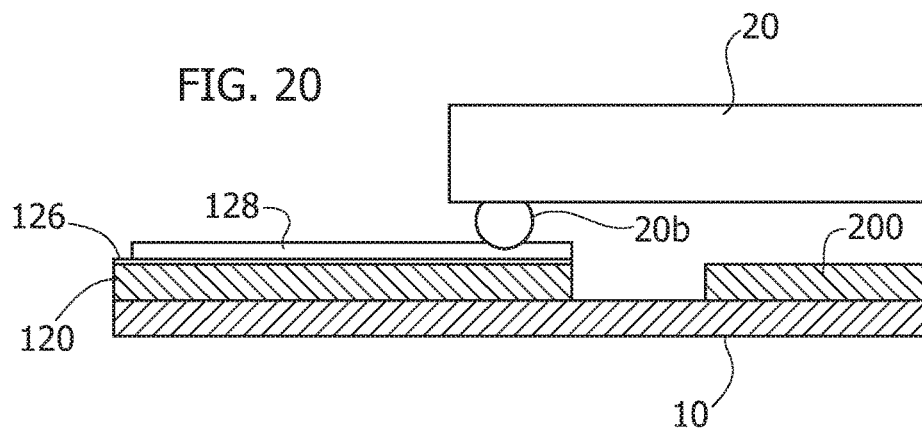

The sequence of FIGS. 19 and 20 is exemplary of the possibility of providing the connections 20b (power or signal capacitance connection) by dipping the bump(s) provided on the die 20 into an un-sintered or un-cured material of the layer 128 (to be subsequently sintered or cured) or by coupling a (smaller) bump in an already sintered or cured material of the conductive layer 128.

Both options exemplified in FIGS. 19 and 20 provide the possibility of controlling the bump "height" (indicated H in FIG. 19).

Figure 21:
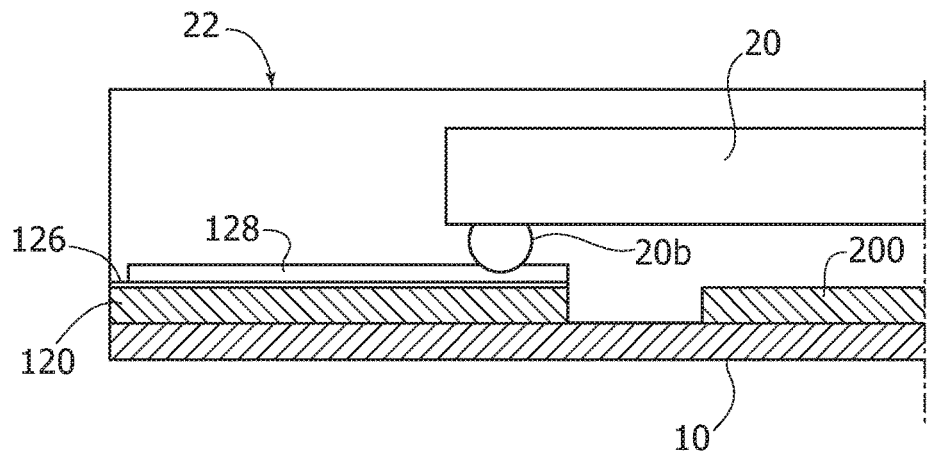
Figure 22:
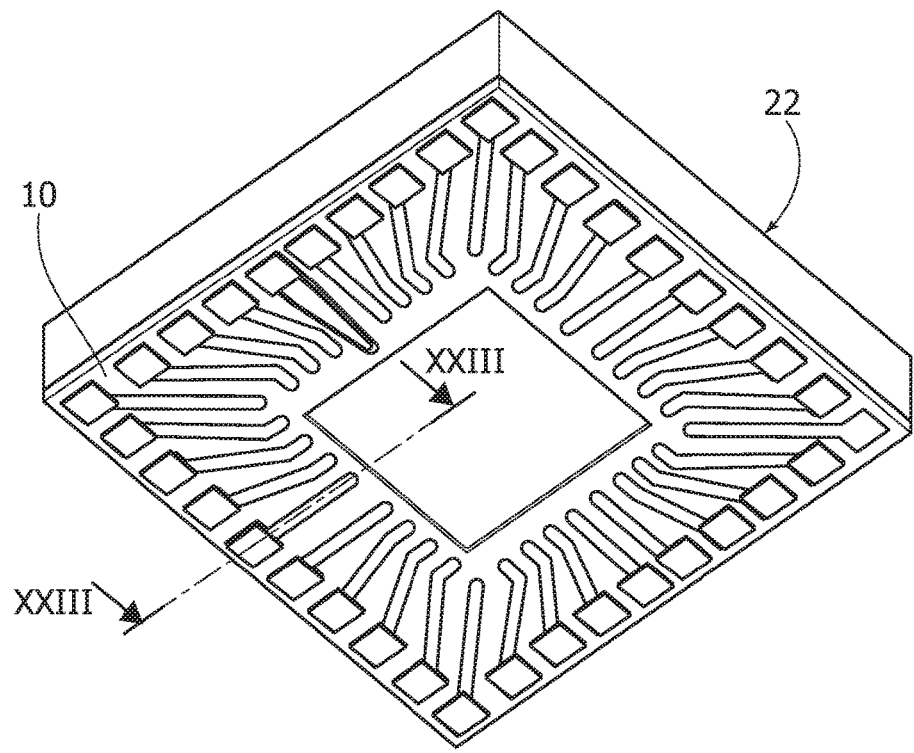

FIG. 21 is exemplary of the possibility of molding a package molding compound 22 onto the structure thus produced, followed by back etching (FIGS. 22-23) and possible back-sealing with a dielectric jet printing.

Figure 23:
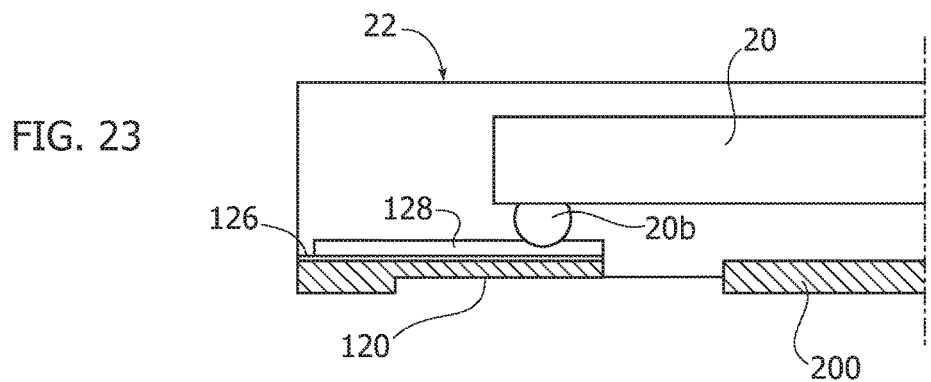
Figure 24:
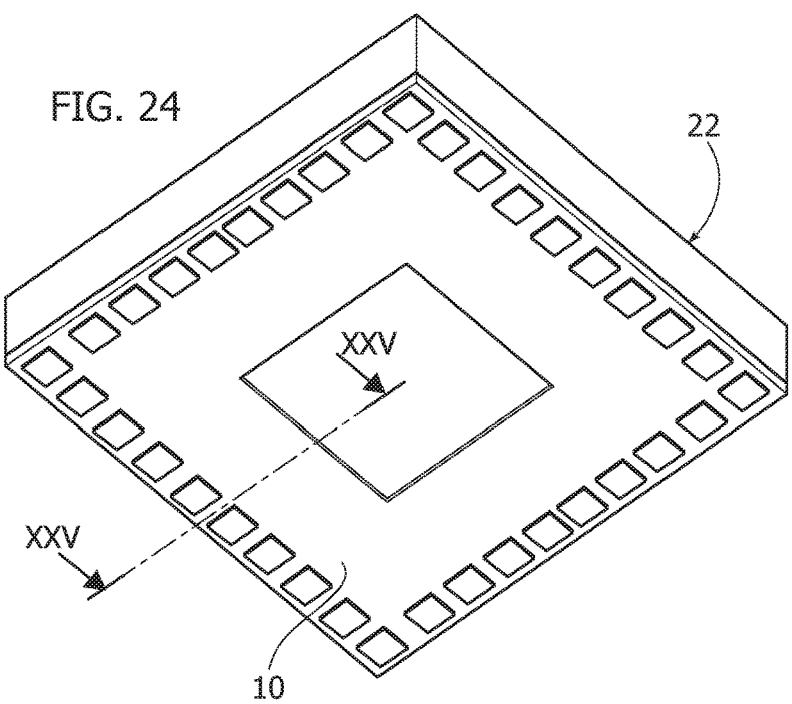

As exemplified in the cross-sectional view of FIG. 23, back etching may produce mechanical separation (and thus electrical insulation) between the peripheral portion of the lead-frame including the capacitor pad 120 and the inner portion including the die pad set 200. Back sealing may correspondingly lead to the formation of an insulating dielectric 24 between the two portions: see, e.g., FIG. 25.

Figure 25:
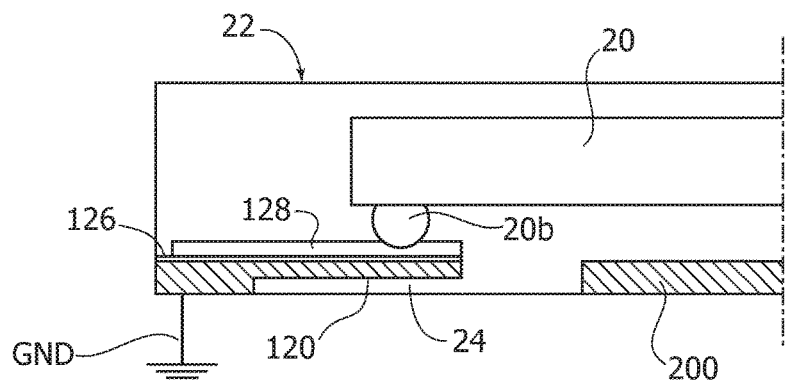

FIG. 25 also exemplifies the possibility of connecting to ground GND the capacitor pad 120 so that the capacitor including the dielectric layer 126 sandwiched between the conductive layer 128 and the pad 120 may be connected (via a connection 20b) between the die 20 and the ground GND.

FIGS. 26 to 34 are exemplary of one or more embodiments wherein the same criteria exemplified in the foregoing may be applied to different types of lead-frame, e.g., a punched or pass-through etched lead-frame 10, possibly arranged over a tape T to contain the molding.

Throughout FIGS. 26 to 34 parts or elements corresponding to parts or elements already discussed in the foregoing are indicated with the same references, thus making it unnecessary to repeat a detailed description herein.

Figure 26:
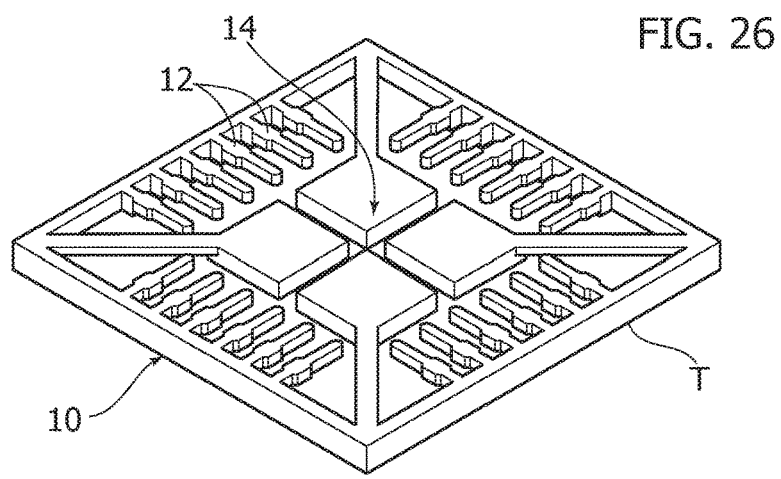
FIGS. 26 to 34 are further exemplary of possible features of embodiments with FIGS. 29 and 31 representing cross-sectional views along line XXIX-XXIX of FIG. 28 and line XXXI-XXXI of Figure, respectively.
Figure 27:
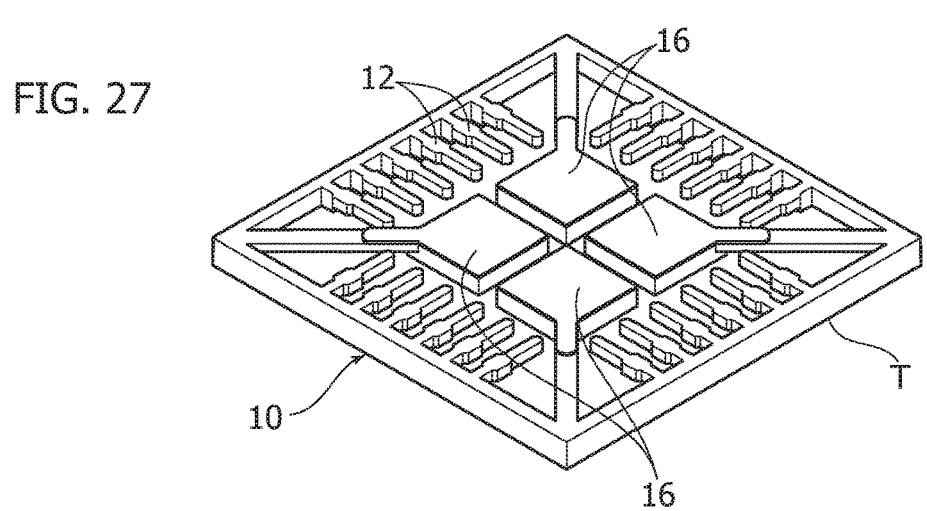

In brief, the sequence of FIGS. 26 and 27 exemplifies the provision (e.g., by screen printing or jet printing, possibly using the same exemplary materials considered in the foregoing) of a dielectric layer 16 over one or more parts 14 (e.g., selectively plated) of a lead-frame 10. Again, the central location of the areas 14 and the possible partition thereof according a cross-like pattern as shown are merely exemplary and not mandatory.

Figure 28:
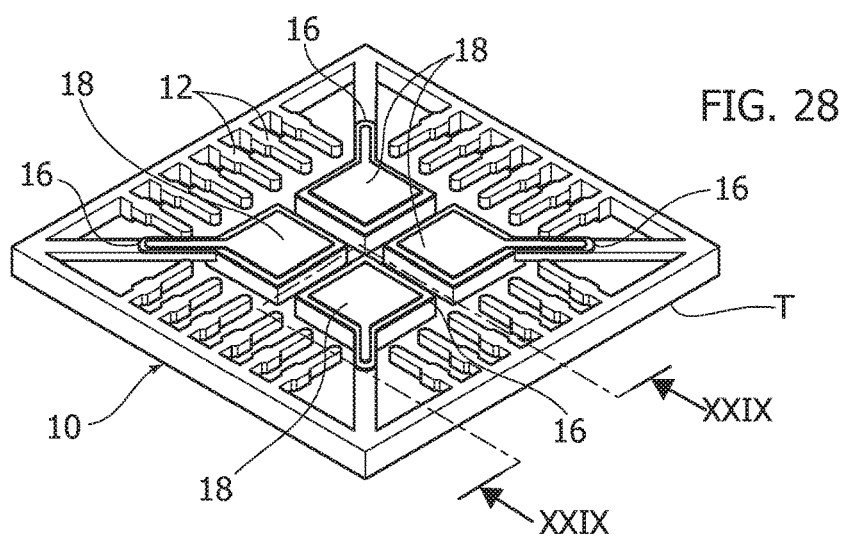
Figure 29:
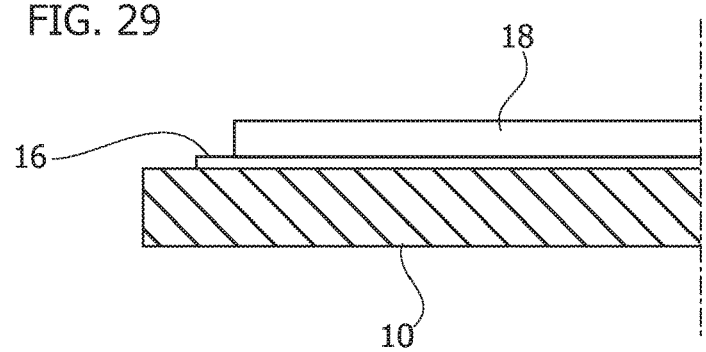

FIG. 28 is exemplary of the possibility of providing (e.g., by screen printing, possibly using for that purpose the same materials exemplified in the foregoing) a conductive layer 18 onto the dielectric layer 16, thus leading to the structure exemplified in FIG. 29.

Such a structure again exhibits a capacitor including a dielectric layer 16 sandwiched between an electrically conductive (e.g., copper) die pad 10 and a similarly electrically conductive layer 18.

FIGS. 30 to 32 are again exemplary of the possibility of mounting onto the structure of FIG. 29 an IC die 20 provided with electrical connections (e.g., bumps) 20b for electrical contact with the conductive layer 18.

In one or more embodiments, the die 20 may be mounted onto a still un-cured conductive layer 18, e.g., with subsequent surface-mount (SMT) reflow and conductive material sintering performed in one step ("one shot"). Also, the capability of controlling the bump height H as exemplified in FIGS. 19 and 20 will again exist.

Figure 30:
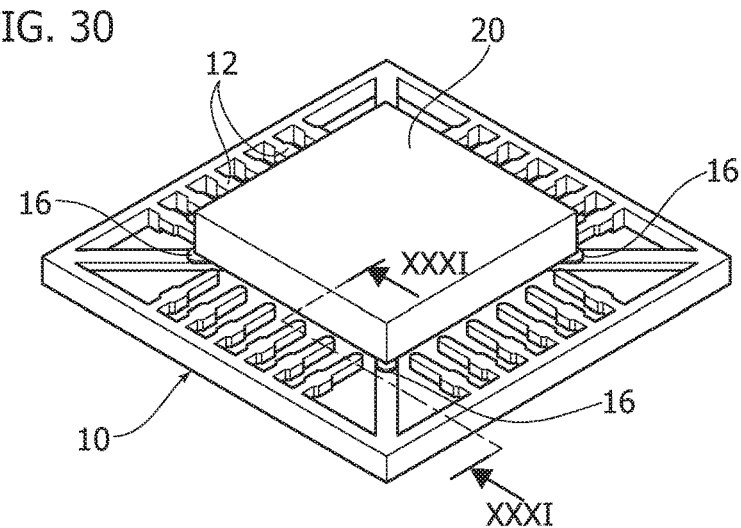
Figure 31:
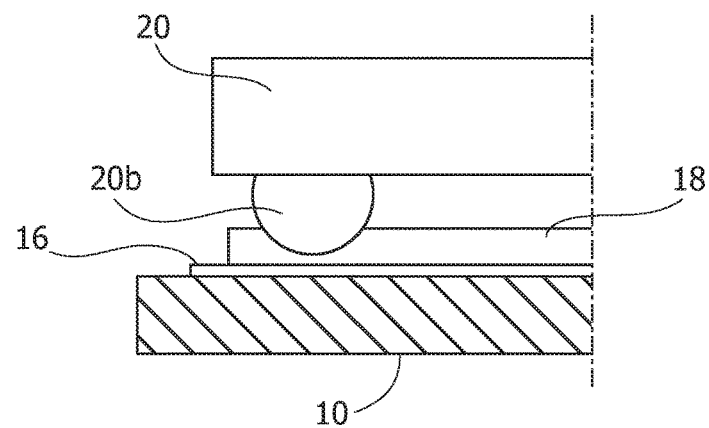
Figure 32:
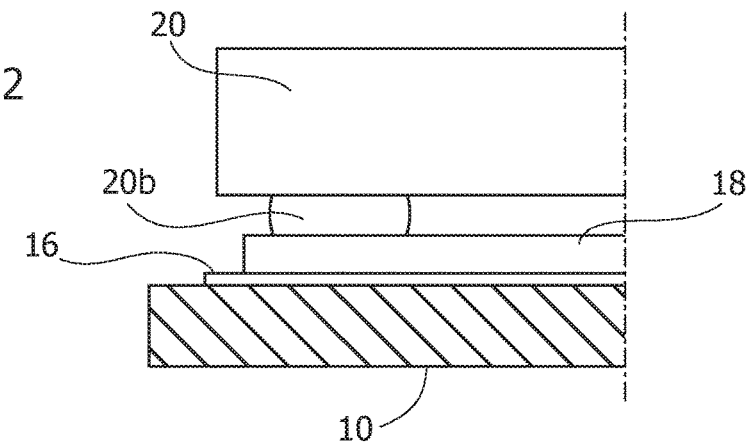
Figure 33:
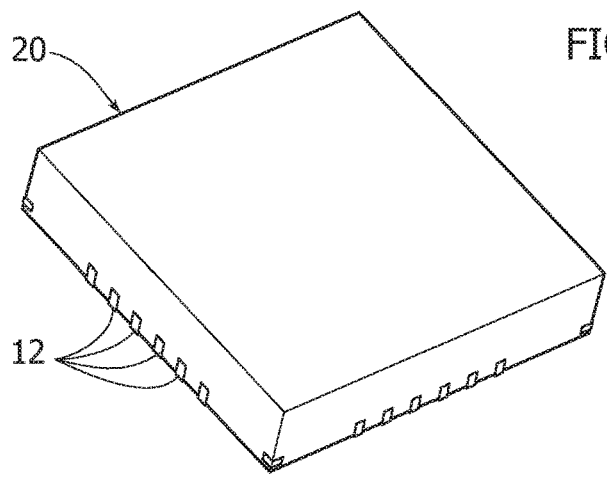
Figure 34:
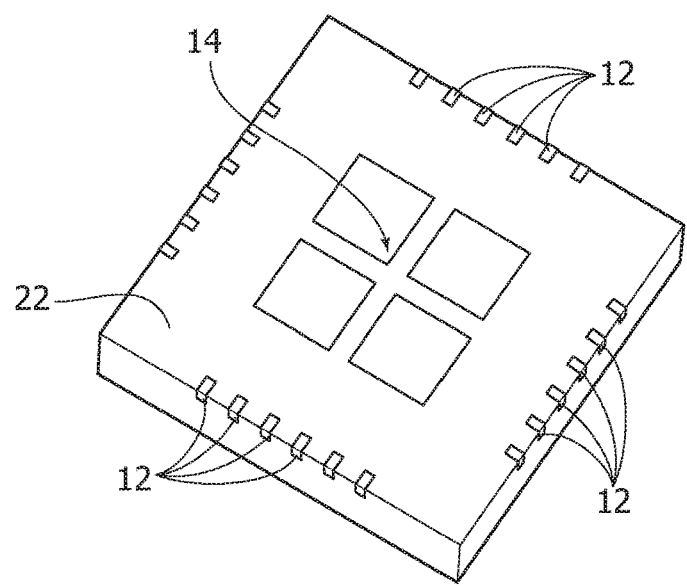

FIGS. 33 and 34 are exemplary of a package 22 being molded onto the structure of FIGS. 30 to 32 with FIG. 34 exemplary of a possible result of back etching to expose electrically conductive contact areas for the resulting semiconductor device.

Without prejudice to the underlying principles, the details and the embodiments may vary, even significantly, with respect of what has been disclosed by way of example only without departing from of the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a capacitor, wherein forming the capacitor includes:
      forming a dielectric layer on an electrically conductive area of a lead-frame, and
      forming an electrically conductive layer on said dielectric layer, wherein forming the electrically conductive layer includes sandwiching said dielectric layer between said electrically conductive area and said electrically conductive layer,
   arranging a semiconductor die onto said lead-frame and electrically connecting said semiconductor die to said electrically conductive layer, wherein electrically connecting said semiconductor die to said electrically conductive layer includes forming conductive bumps on the semiconductor die, and
   reflowing the conductive bumps while sintering or curing said electrically conductive layer.

2. The method of claim 1, wherein forming said dielectric layer includes screen printing or jet printing.

3. The method of claim 1, wherein forming said electrically conductive layer includes providing said electrically conductive layer by screen printing.

4. The method of claim 1, including selecting said electrically conductive area out of:
   a central area of said lead-frame, and
   a peripheral area of said lead-frame, wherein sandwiching the dielectric layer includes sandwiching the dielectric layer between the selected electrically conductive area and the electrically conductive layer.

5. The method of claim 1, including:
   selecting said electrically conductive area as a peripheral area of said lead-frame, and
   i) connecting to ground said peripheral area of said lead-frame, and/or
   ii) providing electrical insulation between said peripheral area and a central area of said lead-frame.

6. The method of claim 1, wherein said electrically conductive area is a recessed area of said lead-frame, said recessed area housing said dielectric layer and said electrically conductive layer.

7. The method of claim 1, including molding an electrically insulating layer onto said semiconductor die arranged onto said lead-frame.

8. A method, comprising:
   forming a capacitor, wherein forming the capacitor includes:
      forming a dielectric layer on an electrically conductive area of a lead-frame, and
      forming an electrically conductive layer on said dielectric layer, wherein forming the electrically conductive layer includes sandwiching said dielectric layer between said electrically conductive area and said electrically conductive layer;

arranging a semiconductor die onto said lead-frame after forming the capacitor; and electrically connecting said semiconductor die to said electrically conductive layer, wherein electrically connecting said semiconductor die to said electrically conductive layer includes forming at least one conductive bump in contact with the semiconductor die and the electrically conductive layer.

9. The method of claim 8, wherein:

forming said dielectric layer includes printing said dielectric layer directly onto the electrically conductive area of the lead-frame; and forming said electrically conductive layer includes printing said electrically conductive layer directly onto the dielectric layer.

10. The method of claim 8, wherein arranging said semiconductor die onto said lead-frame includes placing the semiconductor die in electrical contact with said electrically conductive layer in an unsintered or uncured state, and the method further comprises sintering or curing said electrically conductive layer.

11. A method, comprising:

forming a capacitor, wherein forming the capacitor includes:
  forming a dielectric layer on an electrically conductive area of a lead-frame, and
  forming an electrically conductive layer on said dielectric layer, wherein forming the electrically conductive layer includes sandwiching said dielectric layer between said electrically conductive area and said electrically conductive layer;

forming conductive bumps on a semiconductor die;

after forming the conductive bumps on the semiconductor die, arranging a semiconductor die onto said lead-frame and contacting the conductive bumps to said electrically conductive layer to electrically couple the semiconductor die to the electrically conductive layer; and sintering or curing at least one of said dielectric layer and said electrically conductive layer.

12. The method of claim 11, wherein forming said electrically conductive layer includes providing said electrically conductive layer by screen printing.

13. The method of claim 11, wherein said electrically conductive area is a recessed area of said lead-frame, said recessed area housing said dielectric layer and said electrically conductive layer.

14. A method, comprising:

forming a capacitor, wherein forming the capacitor includes:
  forming a dielectric layer on an electrically conductive area of a lead-frame, and
  forming an electrically conductive layer on said dielectric layer, wherein forming the electrically conductive layer includes sandwiching said dielectric layer between said electrically conductive area and said electrically conductive layer;

arranging a semiconductor die onto said lead-frame after forming the capacitor; and electrically connecting said semiconductor die to said electrically conductive layer, wherein forming said dielectric layer includes printing said dielectric layer directly onto the electrically conductive area of the lead-frame; and wherein forming said electrically conductive layer includes printing said electrically conductive layer directly onto the dielectric layer.

15. The method of claim 14, wherein arranging said semiconductor die onto said lead-frame includes placing the semiconductor die in electrical contact with said electrically conductive layer in an unsintered or uncured state, and the method further comprises sintering or curing said electrically conductive layer.

16. A method, comprising:

forming a capacitor, wherein forming the capacitor includes:
  forming a dielectric layer on an electrically conductive area of a lead-frame, and
  forming an electrically conductive layer on said dielectric layer, wherein forming the electrically conductive layer includes sandwiching said dielectric layer between said electrically conductive area and said electrically conductive layer;

forming conductive bumps on a semiconductor die; and after forming the conductive bumps on the semiconductor die, arranging a semiconductor die onto said lead-frame and contacting the conductive bumps to said electrically conductive layer to electrically couple the semiconductor die to the electrically conductive layer, wherein forming said electrically conductive layer includes providing said electrically conductive layer by screen printing.

17. The method of claim 16, wherein said electrically conductive area is a recessed area of said lead-frame, said recessed area housing said dielectric layer and said electrically conductive layer.

18. A method, comprising:

forming a capacitor, wherein forming the capacitor includes:
  forming a dielectric layer on an electrically conductive area of a lead-frame, and
  forming an electrically conductive layer on said dielectric layer, wherein forming the electrically conductive layer includes sandwiching said dielectric layer between said electrically conductive area and said electrically conductive layer;

forming conductive bumps on a semiconductor die;

after forming the conductive bumps on the semiconductor die, arranging a semiconductor die onto said lead-frame and contacting the conductive bumps to said electrically conductive layer to electrically couple the semiconductor die to the electrically conductive layer, wherein arranging said semiconductor die onto said lead-frame includes placing the conductive bumps in electrical contact with said electrically conductive layer in an unsintered or uncured state; and sintering or curing said electrically conductive layer.

19. The method of claim 18, wherein forming said dielectric layer includes screen printing or jet printing.

* * * * *